United States Patent
Ding et al.

(10) Patent No.: US 10,654,711 B2
(45) Date of Patent: May 19, 2020

(54) DROPLET CONTROL AND DETECTION DEVICE, OPERATING METHOD THEREOF, AND MICROFLUIDIC DEVICE

(71) Applicant: BOE TECHNOLOGY GROUP CO., LTD., Beijing (CN)

(72) Inventors: Xiaoliang Ding, Beijing (CN); Xue Dong, Beijing (CN); Haisheng Wang, Beijing (CN); Yingming Liu, Beijing (CN); Xueyou Cao, Beijing (CN); Yuzhen Guo, Beijing (CN); Ping Zhang, Beijing (CN); Pengpeng Wang, Beijing (CN); Yanling Han, Beijing (CN); Chihjen Cheng, Beijing (CN); Likai Deng, Beijing (CN); Yangbing Li, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 275 days.

(21) Appl. No.: 15/936,548

(22) Filed: Mar. 27, 2018

(65) Prior Publication Data
US 2019/0092623 A1    Mar. 28, 2019

(30) Foreign Application Priority Data

Sep. 27, 2017    (CN) .......................... 2017 1 0888714

(51) Int. Cl.
*B81B 7/02*    (2006.01)
*H01L 27/32*    (2006.01)
(Continued)

(52) U.S. Cl.
CPC .......... *B81B 7/02* (2013.01); *B01L 3/502715* (2013.01); *B01L 3/502784* (2013.01); *G01N 27/44721* (2013.01); *G01N 27/44791* (2013.01); *H01L 27/3227* (2013.01); *B01L 2200/10* (2013.01); *B01L 2200/143* (2013.01); *B01L 2300/0645* (2013.01);
(Continued)

(58) Field of Classification Search
None
See application file for complete search history.

(56) References Cited

U.S. PATENT DOCUMENTS 7,214,302 B1 *   5/2007   Reihs .................... B01L 3/0241
                                                                         204/450
7,569,129 B2 *   8/2009   Pamula ............... B01F 11/0071
                                                                         204/450
(Continued)

*Primary Examiner* — Kara E. Geisel
*Assistant Examiner* — Jarreas C Underwood
(74) *Attorney, Agent, or Firm* — Brooks Kushman P.C.

(57) ABSTRACT

A droplet control and detection device and an operating method thereof are provided. The droplet control and detection device includes: a light source; a first electrode; a second electrode; a droplet arranged on a light-exiting side of the light source, where the droplet is movable under the effect of an electric field formed between the first electrode and the second electrode; a photoelectric detection structure configured to detect light emitted by the light source and reflected by the droplet; and a processing circuit configured to obtain droplet information according to a detection result of the photoelectric detection structure and control an electrical signal applied on the first electrode and the second electrode according to the droplet information.

16 Claims, 1 Drawing Sheet

(51) Int. Cl.
*G01N 27/447* (2006.01)
*B01L 3/00* (2006.01)
*H01L 51/52* (2006.01)

(52) U.S. Cl.
CPC . *B01L 2300/0663* (2013.01); *B01L 2300/165* (2013.01); *B01L 2400/0427* (2013.01); *B81B 2201/058* (2013.01); *B81B 2203/0315* (2013.01); *B81B 2203/04* (2013.01); *B81B 2203/055* (2013.01); *H01L 51/5253* (2013.01)

(56) References Cited

U.S. PATENT DOCUMENTS

| | | | | |
|---|---|---|---|---|
| 8,147,668 B2* | 4/2012 | Pollack | ............... | B01F 13/0071 |
| | | | | 204/547 |
| 8,926,065 B2* | 1/2015 | Winger | ................. | B41J 2/1606 |
| | | | | 347/45 |
| 2003/0164295 A1* | 9/2003 | Sterling | ............. | B01L 3/50273 |
| | | | | 204/450 |
| 2009/0316253 A1* | 12/2009 | Fairley | ................. | G02B 26/004 |
| | | | | 359/292 |
| 2011/0000560 A1* | 1/2011 | Miller | ................. | B01F 13/0071 |
| | | | | 137/561 R |
| 2012/0007608 A1* | 1/2012 | Hadwen | ............. | B01L 3/50273 |
| | | | | 324/649 |
| 2012/0106238 A1* | 5/2012 | John | ................... | B01L 3/50273 |
| | | | | 365/154 |
| 2013/0271153 A1* | 10/2013 | Hadwen | ............ | B01L 3/502707 |
| | | | | 324/551 |

* cited by examiner

DROPLET CONTROL AND DETECTION DEVICE, OPERATING METHOD THEREOF, AND MICROFLUIDIC DEVICE

CROSS-REFERENCE TO RELATED APPLICATION

This application claims priority to Chinese Patent Application No. 201710888714.4 filed on Sep. 27, 2017, which is incorporated herein by reference in its entirety.

TECHNICAL FIELD

The present disclosure relates to the field of microfluidic technologies, in particular to a droplet control and detection device and an operating method thereof.

BACKGROUND

Microfluidics refers to a science and technology involved in a system configured to process or manipulate tiny fluids (a volume of the fluid ranging from a nano-liter to a micron-liter) through a micro-pipe (a size of the micro-pipe ranging from tens of micrometers to hundreds of micrometers), and is an emerging cross discipline involved in disciplines of chemistry, fluid physics, microelectronics, new materials, biology and biomedical engineering. Because of its characteristics such as miniaturization and integration, a microfluidic device is often referred to as a microfluidic chip, and is also referred to as a lab on a chip and a micro-total analytical system. The early concept of the microfluidics may be traced back to a gas chromatograph device fabricated on a silicon wafer through a photolithography in the 1870s, and is later developed into a microfluidic capillary electrophoresis apparatus and a micro-reactor. One of the important characteristics of the microfluidics is unique fluid properties in a micro-scale environment, such as laminar flow and droplets. With these unique fluid phenomena, the microfluidics may achieve micro-fabrication and micro-manipulation that are difficult to accomplish with a range of conventional methods. At present, the microfluidics is considered to have immense potential for development and broad application prospects in a biomedical research.

However, the existing microfluidic devices have the following disadvantages. A structure of the microfluidic device is relatively complicated, the production cost is high, and the accuracy of droplet control needs to be improved.

SUMMARY

In an aspect, at least one of embodiments of the present disclosure provides a droplet control and detection device. The droplet control and detection device includes: a light source; a first electrode; a second electrode; a droplet arranged on a light-exiting side of the light source, where the droplet is movable under the effect of an electric field formed between the first electrode and the second electrode; a photoelectric detection structure configured to detect light emitted by the light source and reflected by the droplet; and a processing circuit configured to obtain droplet information according to a detection result of the photoelectric detection structure and control an electrical signal applied on the first electrode and the second electrode according to the droplet information.

In some optional embodiments, the droplet information includes at least one of a position parameter, an appearance parameter and a component parameter of the droplet.

In some optional embodiments, the droplet control and detection device further includes a first hydrophobic layer and a second hydrophobic layer oppositely arranged and on the light-exiting side of the light source, where the first hydrophobic layer and the second hydrophobic layer are spaced by a predetermined distance, and the droplet is arranged between the first hydrophobic layer and the second hydrophobic layer.

In some optional embodiments, the droplet control and detection device further includes a first insulation layer covering the first electrode, where the second electrode is arranged on the first insulation layer; a second insulation layer covering the second electrode, where the first hydrophobic layer is arranged on the second insulation layer; and a spacer arranged between the first hydrophobic layer and the second hydrophobic layer and configured to support the second hydrophobic layer in such a manner that the first hydrophobic layer and the second hydrophobic layer are spaced by the predetermined distance.

In some optional embodiments, the droplet control and detection device further includes a protection layer covering the second hydrophobic layer.

In some optional embodiments, each of the first electrode and the second electrode includes a plurality of strip-shaped electrodes, and an extension direction of the strip-shaped electrodes of the first electrode is perpendicular to an extension direction of the strip-shaped electrodes of the second electrode.

In some optional embodiments, a difference value between a width of the first electrode and a diameter of the droplet is not greater than a preset threshold, and a difference value between a width of the second electrode and the diameter of the droplet is not greater than the preset threshold.

In some optional embodiments, the droplet control and detection device is integrated in a display substrate, and at least one of the first electrode and the second electrode is a display electrode of the display substrate.

In some optional embodiments, the display substrate is an organic light-emitting diode (OLED) display substrate, the light source is a light-emitting unit of the OLED display substrate, the first electrode is a patterned cathode of the OLED display substrate, the first insulation layer is a thin film encapsulation layer of the OLED display substrate, and the second electrode is an electrode formed on the thin film encapsulation layer.

In some optional embodiments, the photoelectric detection structure is a photodiode or a photosensitive thin film transistor integrated in the OLED display substrate.

In some optional embodiments, the droplet control and detection device further includes: a first signal line connected with the processing circuit and the first electrode; a second signal line connected with the processing circuit and the second electrode; and a detection signal line connected with the processing circuit and the photoelectric detection structure.

Some optional embodiments of the present disclosure further provide an operating method for the droplet control and detection device. The operating method includes: controlling the light source to emit light; detecting, by the photoelectric detection structure, the light emitted by the light source and reflected by the droplet; obtaining the droplet information according to the detection result; and controlling the electrical signal applied on the first electrode and the second electrode according to the droplet information in such a manner that the droplet is driven to move by the electric field generated between the first electrode and the second electrode.

In some optional embodiments, the droplet control and detection device is integrated in the display substrate, at least one of the first electrode and the second electrode is a display electrode of the display substrate, the display substrate is an OLED display substrate, the light source is a light-emitting unit of the OLED display substrate, the first electrode is a patterned cathode of the OLED display substrate, the first insulation layer is a thin film encapsulation layer of the OLED display substrate, the second electrode is an electrode formed on the thin film encapsulation layer, the photoelectric detection structure is a photodiode or a photosensitive thin film transistor integrated in the OLED display substrate, and the operating method includes: turning on the light-emitting unit of the OLED display substrate; detecting, by the photodiode or the photosensitive thin film transistor integrated in the OLED display substrate, the light emitted by the light source and reflected by the droplet; and obtaining the droplet information according to the detection result, and controlling the electrical signal applied on the patterned cathode of the OLED display substrate and the second electrode according to the droplet information.

Some optional embodiments of the present disclosure further provide a microfluidic device. The microfluidic device includes: a base substrate; a pixel circuit and a photoelectric detection structure on the base substrate, where the pixel circuit includes an anode; a light-emitting unit on the pixel circuit and the photoelectric detection structure; a cathode on the light-emitting unit, where the light-emitting unit is capable of emitting light under the effect of an electric field generated between the anode and the cathode; an insulating film encapsulation layer on the cathode; a second electrode on the film encapsulation layer; a first hydrophobic layer on the second electrode; a droplet and a spacer on the first hydrophobic layer; a second hydrophobic layer on the droplet and the spacer, where the droplet is movable under an electric field generated between the cathode and the second electrode, and the spacer is configured to support the second hydrophobic layer in such a manner that the first hydrophobic layer and the second hydrophobic layer are spaced by the predetermined distance. The microfluidic device further includes: a processing circuit, configured to obtain droplet information according to a detection result of the photoelectric detection structure, control an electrical signal applied on the cathode and the second electrode according to the droplet information, and control the droplet to be moved by the electric field generated between the cathode and the second electrode.

In some optional embodiments, the droplet information includes at least one of a position parameter, an appearance parameter and a component parameter of the droplet.

In some optional embodiments, the microfluidic device further includes a protection layer covering the second hydrophobic layer.

In some optional embodiments, each of the cathode and the second electrode includes a plurality of strip-shaped electrodes, and an extension direction of the strip-shaped electrodes of the first electrode is perpendicular to an extension direction of the strip-shaped electrodes of the second electrode.

In some optional embodiments, a difference value between a width of the cathode and a diameter of the droplet is not greater than a preset threshold, and a difference value between a width of the second electrode and the diameter of the droplet is not greater than the preset threshold.

In some optional embodiments, the photoelectric detection structure is a photodiode or a photosensitive thin film transistor.

DETAILED DESCRIPTION

Figure 1:
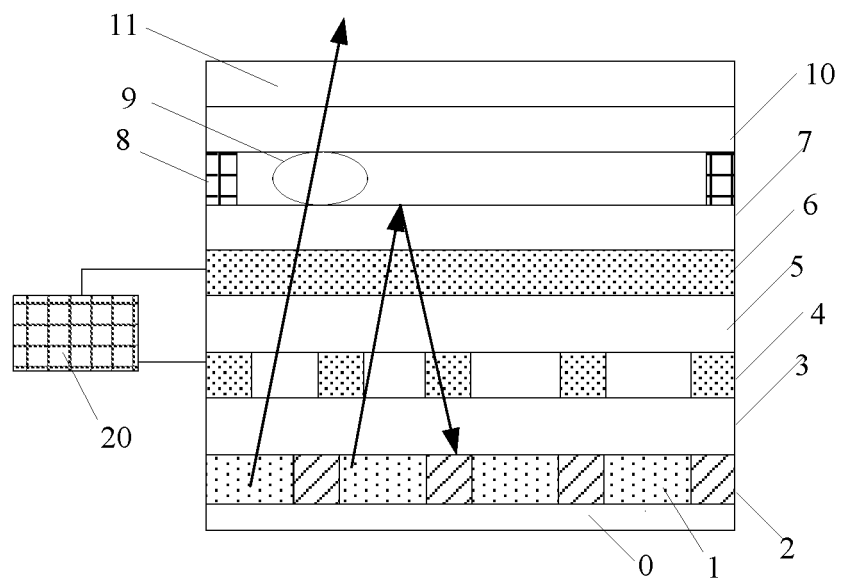
FIGS. 1 and 2 each is a schematic diagram of a droplet control and detection device according to embodiments of the present disclosure.

To make the technical problem to be solved, the technical solution and advantages of the present disclosure clearer, hereinafter the specific embodiment will be described in detail in conjunction with drawings. Apparently, the described embodiments are merely a few rather than all of the embodiments of the present disclosure. All other embodiments obtained by persons of ordinary skill in the art based on the embodiments of the present disclosure without creative efforts shall fall within the protection scope of the present disclosure.

In the related art, a structure of a microfluidic device is relatively complicated, the production cost is relatively high, and the accuracy of droplet control needs to be improved. Accordingly, the embodiments of the present disclosure provide a droplet control and detection device and an operating method thereof, which may achieve the efficient and accurate droplet control.

A droplet control and detection device is provided according to the embodiments of the present disclosure. The droplet control and detection device includes: a light source; a first electrode; a second electrode; a droplet arranged on a light-exiting side of the light source, where the droplet is movable under the effect of an electric field generated between the first electrode and the second electrode; a photoelectric detection structure configured to detect light emitted by the light source and reflected by the droplet; and a processing circuit configured to obtain droplet information according to a detection result of the photoelectric detection structure and control an electrical signal applied on the first electrode and the second electrode according to the droplet information.

In the embodiments, when the droplet control and detection device is in operation, the electrical signal is applied on the first electrode and the second electrode in such a manner that the droplet is driven to move under the effect of an electric field between the first electrode and the second electrode, the light emitted by the light source and reflected by the droplet is detected by the photoelectric detection structure, and the droplet information is obtained according to the detection result. In such a manner, the droplet may be monitored in a real-time manner, and the electric field for driving the droplet to move may be regulated according to the droplet information, thereby achieving the efficient and accurate droplet control.

In some optional embodiments, the droplet information includes at least one of a position parameter, an appearance parameter and a component parameter of the droplet. The position parameter includes a specific position of the droplet, the appearance parameter may include a size and a shape of the droplet, and the component parameter includes a specific component of the droplet.

In some optional embodiments, the droplet control and detection device further includes a first hydrophobic layer and a second hydrophobic layer oppositely arranged and on the light-exiting side of the light source. The first hydrophobic layer and the second hydrophobic layer are spaced by a predetermined distance, and the droplet is arranged between the first hydrophobic layer and the second hydrophobic layer. In such a manner, a resistance force of the droplet generated in moving may be small, and it is easier for the droplet to be moved under the effect of the electric field.

In some optional embodiments, the droplet control and detection device further includes: a light source; a first electrode arranged on a light-exiting side of the light source; a first insulation layer covering the first electrode, a second electrode arranged on the first insulation layer; a second insulation layer covering the second electrode; a first hydrophobic layer arranged on the second insulation layer; a spacer and the droplet arranged on the first hydrophobic layer; and a second hydrophobic layer arranged on the spacer. The spacer is configured to support the second hydrophobic layer in such a manner that the first hydrophobic layer and the second hydrophobic layer are spaced by the predetermined distance.

The predetermined distance may be adjusted according the actual fabrication accuracy. Optional, the predetermined distance may be one third of a pitch of the first electrode, or one third of a pitch of the second electrode. For example, when the pitch of the first electrode or the pitch of the second electrode is 300 um, the distance between the first hydrophobic layer and the second hydrophobic layer may be preset as 100 um.

In some optional embodiments, the droplet control and detection device further includes a protection layer covering the second hydrophobic layer. The protection layer is capable of protecting the whole droplet control and detection device, so as to improve the damage resistance capability of the droplet control and detection device. Specifically, the protective layer may be made of an inorganic material such as silicon nitride or organic resin material, which is an insulation material.

In some optional embodiments, each of the first electrode and the second electrode is strip-shaped, and an extension direction of the first electrode is perpendicular to an extension direction of the second electrode. Optionally, the first electrode and the second electrode may also be of other shapes. The shapes of the first electrode and the second electrode are not specifically limited by the embodiments of the present disclosure.

In some optional embodiments, a difference value between a width of the first electrode and a diameter of the droplet is not greater than a preset threshold, and a difference value between a width of the second electrode and the diameter of the droplet is not greater than the preset threshold, in the case that each of the first electrode and the second electrode is strip-shaped. In such a manner, the widths of the first electrode and the second electrode may be matched with the width of the droplet, which enables the second electrode and the first electrode to drive the droplet to be moved more accurately. The preset threshold may be adjusted according to the actual control accuracy. In some optional embodiments, each of the widths of the first electrode and the second electrode may be one-half of a diameter of the droplet.

In some optional embodiments, the droplet control and detection device is integrated in a display substrate, and at least one of the first electrode and the second electrode is a display electrode of the display substrate. In such a manner, the droplet control detection device may be manufactured by using an apparatus for manufacturing the existing display substrate, thereby reducing the production cost of the droplet control and detection device.

The display substrate may be a liquid crystal display substrate or an OLED display substrate. The technical solution of the present disclosure will be described in detail in conjunction with the drawings by taking an example that the display substrate is an OLED display substrate.

As shown in FIG. 1, the OLED display substrate includes: a pixel circuit 1, a photoelectric detection structure 2, an anode (which may be integrated in the pixel circuit 1), a light-emitting unit 3, a cathode 4 and a thin film encapsulation layer 5, which are sequentially arranged on a base substrate 0. The pixel circuit 1 is configured to apply an electrical signal to the anode and the cathode 4, which enables the light-emitting unit 3 to emit light under the effect of an electric field of the anode and the cathode 4. In the embodiments, a droplet control and detection device may be fabricated on the basis of the above structure, and the light-emitting unit 3 may serve as a light source of the droplet control and detection device. In addition, in the embodiments, the cathode 4 of the OLED display substrate is patterned to serve as a first electrode of the droplet control and detection device. Specifically, the cathode 4 may be fabricated as a strip-shaped electrode, and a width of the first electrode may be determined according to a size of the droplet 9 to be controlled. In addition, the photoelectric detection structure 2 is also integrated in the OLED display substrate, the droplet control and detection device may detect light emitted by the light source and reflected by the droplet 9 through the photoelectric detection structure 2, obtain droplet information according a detection result, and control an electric field applied on the droplet 9 according to the droplet information. The photoelectric detection structure 2 may specifically be a photodiode or a photosensitive thin film transistor.

Figure 2:
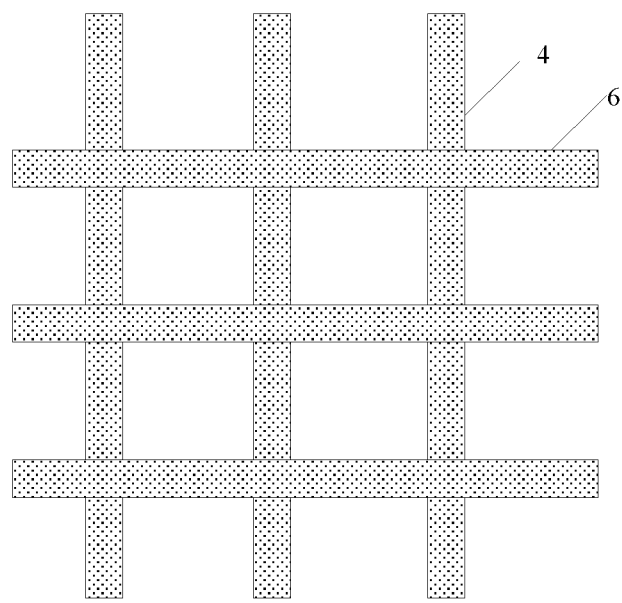

In addition, in the embodiments, a second electrode 6 is further formed on the thin film encapsulation layer 5, the electric field for driving the droplet 9 to be moved may be generated by applying an electric signal to the cathode 4 and the second electrode 6, and the second electrode 6 is preferably made of a transparent conductive material. The second electrode 6 may also be made to be a strip-shaped electrode, as shown in FIG. 2. An extending direction of the cathode 4 is perpendicular to an extending direction of the second electrode 6, and a width of the second electrode 6 may also be determined by a size of the droplet 9 to be controlled.

In some optional embodiments, a first hydrophobic layer 7 is further formed on the second electrode 6 to facilitate the movement of the droplet 9. As shown in FIG. 1, the droplet control and detection device further includes a second hydrophobic layer 10 and a protection layer 11 covering the second hydrophobic layer 10. A spacer 8 is arranged between the first hydrophobic layer 7 and the second hydrophobic layer 10, which may maintain a distance between the first hydrophobic layer 7 and the second hydrophobic layer 10. The droplet 9 to be tested is dropped on the first hydrophobic layer 7 and below the second hydrophobic layer 10, and the droplet 9 and the spacer 8 are in the same layer.

In some optional embodiments, the droplet control and detection device further includes: a first signal line connected with the processing circuit 20 and the first electrode; a second signal line connected with the processing circuit and the second electrode 6; and a detection signal line connected with the processing circuit and the photoelectric detection structure 2. The electrical signal may be applied on the first electrode and the second electrode via the first signal line and the second signal line, the processing circuit may receive the detection result of the photoelectric detection structure 2 via the detection signal line, and then a position parameter, an appearance parameter and a component parameter of the droplet 9 are obtained according to the detection result.

When the droplet control and detection device is in operation, a common voltage may be applied on the second electrode 6, the cathode 4 of the OLED display substrate may be acted as a drive electrode, and the droplet 9 may be driven to move by applying a different voltage on the cathode 4. In addition, in order to accurately control the movement of the droplet 9, the droplet 9 is monitored in a real-time manner through the photoelectric detection structure 2, as shown in FIG. 1. In a case that there is no droplet 9 above the photoelectric detection structure 2, an interface refractive index when the light emitted by the light-emitting unit 3 exits the first hydrophobic layer 7 is greatly changed, and thus the light reflected back to the photoelectric detection structure 2 is strong. In a case that the droplet 9 is above the photoelectric detection structure 2, the interface refractive index when the light emitted by the light-emitting unit 3 exits the first hydrophobic layer 7 is not greatly changed, and most of the light is transmitted through the first hydrophobic layer 7, thus the light reflected back to the photoelectric detection structure 2 is weak. In such a manner, the photoelectric detection structure 2 may detect the received light reflected by the droplet 9, then the processing circuit may determine the droplet information according to the detection result of the photoelectric detection structure 2, which includes a position, a size, a shape and a composition of the droplet 9, and the electric field applied on the droplet 9 is adjusted in a real-time manner according to the droplet information to control the movement of the droplet 9. Specifically, the electric field is regulated through the electrical signal applied on the cathode 4.

Embodiments of the present disclosure further provide an operating method, applied to the above droplet control and detection device. The operating method includes: controlling the light source to emit light; detecting, by the photoelectric detection structure, the light emitted by the light source and reflected by the droplet; obtaining the droplet information according to the detection result; and controlling the electrical signal applied on the first electrode and the second electrode according to the droplet information in such a manner that the droplet is driven to move by an electric field generated between the first electrode and the second electrode.

In the embodiments, when the droplet control and detection device is in operation, the electrical signal is applied on the first electrode and the second electrode in such a manner that the droplet is driven to move under the effect of the electric field between the first electrode and the second electrode, the light emitted by the light source and reflected by the droplet is detected by the photoelectric detection structure, and the droplet information is obtained according to the detection result. In such a manner, the droplet may be monitored in a real-time manner, and the electric field for driving the droplet to move may be regulated according to the droplet information, thereby achieving the efficient and accurate droplet control.

In some optional embodiment, the droplet control and detection device may be integrated in an OLED display substrate. As shown in FIG. 1, the OLED display substrate includes: a pixel circuit 1, a photoelectric detection structure 2, an anode (which may be integrated in the pixel circuit 1), a light-emitting unit 3, a cathode 4 and a thin film encapsulation layer 5, which are sequentially arranged on a base substrate 0. The pixel circuit 1 is configured to apply an electrical signal on the anode and the cathode 4, which enables the light-emitting unit 3 to emit light under the effect of the electric field of the anode and the cathode 4. In the embodiments, the light-emitting unit 3 may serve as a light source of the droplet control and detection device. In addition, in the embodiments, the cathode 4 of the OLED display substrate is patterned to serve as a first electrode of the droplet control and detection device. Specifically, the cathode 4 may be fabricated as a strip-shaped electrode, and a width of the first electrode may be determined according to a size of the droplet 9 to be controlled. In addition, the photoelectric detection structure 2 is also integrated in the OLED display substrate, the droplet control and detection device may detect light emitted by the light source and reflected by the droplet 9 through the photoelectric detection structure 2, obtain droplet information according a detection result, and control an electric field applied on the droplet 9 according to the droplet information. Specifically, the photoelectric detection structure 2 may be a photodiode or a photosensitive thin film transistor.

In addition, in the embodiments, a second electrode 6 is further formed on the thin film encapsulation layer 5, the electric field for driving the droplet 9 to be moved may be formed by applying an electric signal to the cathode 4 and the second electrode 6, and the second electrode 6 is preferably made of a transparent conductive material. The second electrode 6 may also be made to be a strip-shaped electrode, as shown in FIG. 2. An extending direction of the cathode 4 is perpendicular to an extending direction of the second electrode 6, and a width of the second electrode 6 may also be determined by a size of the droplet 9 to be controlled.

In some optional embodiments, a first hydrophobic layer 7 is further formed on the second electrode 6 to facilitate the movement of the droplet 9. As shown in FIG. 1, the droplet control and detection device further includes a second hydrophobic layer 10 and a protection layer 11 covering the second hydrophobic layer 10. A spacer 8 is arranged between the first hydrophobic layer 7 and the second hydrophobic layer 10, which may maintain a distance between the first hydrophobic layer 7 and the second hydrophobic layer 10. The droplet 9 to be tested is dropped on the first hydrophobic layer 7 and below the second hydrophobic layer 10, and the droplet 9 and the spacer 8 are in the same layer.

In some optional embodiments, the droplet control and detection device further includes: a first signal line connected with the processing circuit and the first electrode; a second signal line connected with the processing circuit and the second electrode 6; and a detection signal line connected with the processing circuit and the photoelectric detection structure 2. The electrical signal may be applied on the first electrode and the second electrode via the first signal line and the second signal line, the processing circuit may receive the detection result of the photoelectric detection structure 2 via the detection signal line, and then a position parameter, an appearance parameter and a component parameter of the droplet 9 are obtained according to the detection result.

When the droplet control and detection device is in operation, the operating method further includes: turning on the light-emitting unit 3 of the OLED display substrate by applying the electrical signal on the anode and the cathode 4 of the OLED display substrate, where the light emitted by the light-emitting unit 3 is capable of illuminating the droplet 9; and detecting the light emitted by the light source and reflected by the droplet 9 through the photodiode or the photosensitive thin film transistor integrated in the OLED display substrate, obtaining the droplet information according to the detection result, and controlling the electrical signal applied on the patterned cathode 4 and the second electrode 6 of the OLED display substrate according to the droplet information.

Specifically, a common voltage may be applied on the second electrode 6, the cathode 4 of the OLED display substrate may be acted as a drive electrode, and the droplet 9 may be driven to move by applying a different voltage to the cathode 4. As shown in FIG. 1, in a case that there is no droplet 9 above the photoelectric detection structure 2, an interface refractive index when the light emitted by the light-emitting unit 3 exits the first hydrophobic layer 7 is greatly changed, and thus the light reflected back to the photoelectric detection structure 2 is strong. In a case that the droplet 9 is above the photoelectric detection structure 2, the interface refractive index when the light emitted by the light-emitting unit 3 exits the first hydrophobic layer 7 is not greatly changed, and most of the light is transmitted through the first hydrophobic layer 7, thus the light reflected back to the photoelectric detection structure 2 is weak. In such a manner, the photoelectric detection structure 2 may detect the received light reflected by the droplet 9, then the processing circuit may determine the droplet information according to the detection result of the photoelectric detection structure 2, which includes a position, a size, a shape and a composition of the droplet 9, and the electric field applied on the droplet 9 is adjusted in a real-time manner according to the droplet information to control the movement of the droplet 9. Specifically, the electric field is regulated through the electrical signal applied on the cathode 4. For example, if a target position of the droplet is position A, but a current position of the droplet is found to be position B by detecting, that is, the movement of the droplet does not meet the intended purpose, the electric field applied on the droplet 9 needs to be regulated in a real-time manner. That is, the electric field at the position B is regulated to control the droplet 9 to continue moving until the droplet 9 moves to the position A.

Unless otherwise defined, technical terms or scientific terms used in the present disclosure should be interpreted according to common meanings thereof as commonly understood by those of ordinary skills in the art. Such terms as "first", "second" and the like used in the present disclosure do not represent any order, quantity or importance, but are merely used to distinguish different components. Such terms as "including", "includes", "include", "comprise", "comprises" or "comprising" and the like mean that an element or an article preceding the term contains elements or items and equivalents thereof behind the term, but does not exclude other elements or items. Such terms as "connect", "connected" or "connecting" and the like are not limited to physical or mechanical connections, but may include electrical connections, whether direct connection or indirect connection. Such terms as "on", "under", "left", "right" and the like are only used to represent a relative position relationship, and when an absolute position of a described object is changed, the relative position relationship thereof may also be changed accordingly.

It may be understood that when an element such as a layer, a film, a region or a substrate is referred to as being "on" or "under" another element, the element may be "directly" "on" or "under" another element, or there may exist an intervening element.

The above embodiments are merely optional embodiments of the present disclosure. It should be noted that numerous improvements and modifications may be made by those skilled in the art without departing from the principle of the present disclosure, and these improvements and modifications shall also fall within the scope of the present disclosure.

What is claimed is:

1. A droplet control and detection device, comprising:
   a light source;
   a first electrode;
   a second electrode;
   a droplet arranged on a light-exiting side of the light source, wherein the droplet is movable under the effect of an electric field formed between the first electrode and the second electrode;
   a photoelectric detection structure, configured to detect light emitted by the light source and reflected by the droplet;
   a processing circuit, configured to obtain droplet information according to a detection result of the photoelectric detection structure and control an electrical signal applied on the first electrode and the second electrode according to the droplet information;
   a first hydrophobic layer and a second hydrophobic layer oppositely arranged and on the light-exiting side of the light source, wherein the first hydrophobic layer and the second hydrophobic layer are spaced by a predetermined distance, and the droplet is arranged between the first hydrophobic layer and the second hydrophobic layer;
   a first insulation layer covering the first electrode, wherein the second electrode is arranged on the first insulation layer;
   a second insulation layer covering the second electrode, wherein the first hydrophobic layer is arranged on the second insulation layer; and
   a spacer arranged between the first hydrophobic layer and the second hydrophobic layer and configured to support the second hydrophobic layer in such a manner that the first hydrophobic layer and the second hydrophobic layer are spaced by the predetermined distance.

2. The droplet control and detection device according to claim 1, wherein the droplet information comprises at least one of a position parameter, an appearance parameter and a component parameter of the droplet.

3. The droplet control and detection device according to claim 1, further comprising:
   a protection layer covering the second hydrophobic layer.

4. The droplet control and detection device according to claim 1, wherein the droplet control and detection device is integrated in a display substrate, and at least one of the first electrode and the second electrode is a display electrode of the display substrate.

5. The droplet control and detection device according to claim 4, wherein the display substrate is an organic light-emitting diode (OLED) display substrate, the light source is a light-emitting unit of the OLED display substrate, the first electrode is a patterned cathode of the OLED display substrate, the first insulation layer is a thin film encapsulation layer of the OLED display substrate, and the second electrode is an electrode formed on the thin film encapsulation layer.

6. The droplet control and detection device according to claim 5, wherein the photoelectric detection structure is a photodiode or a photosensitive thin film transistor integrated in the OLED display substrate.

7. The droplet control and detection device according to claim 1, wherein each of the first electrode and the second electrode comprises a plurality of strip-shaped electrodes, and an extension direction of the strip-shaped electrodes of the first electrode is perpendicular to an extension direction of the strip-shaped electrodes of the second electrode.

8. The droplet control and detection device according to claim 7, wherein a difference value between a width of the first electrode and a diameter of the droplet is not greater than a preset threshold, and a difference value between a width of the second electrode and the diameter of the droplet is not greater than the preset threshold.

9. The droplet control and detection device according to claim 1, further comprising:
a first signal line connected with the processing circuit and the first electrode;
a second signal line connected with the processing circuit and the second electrode; and
a detection signal line connected with the processing circuit and the photoelectric detection structure.

10. An operating method for a droplet control and detection device, the droplet control and detection device comprising:
a light source;
a first electrode;
a second electrode;
a droplet arranged on a light-exiting side of the light source, wherein the droplet is movable under the effect of an electric field formed between the first electrode and the second electrode;
a photoelectric detection structure, configured to detect light emitted by the light source and reflected by the droplet;
a processing circuit, configured to obtain droplet information according to a detection result of the photoelectric detection structure and control an electrical signal applied on the first electrode and the second electrode according to the droplet information;
a first hydrophobic layer and a second hydrophobic layer oppositely arranged and on the light-exiting side of the light source, wherein the first hydrophobic layer and the second hydrophobic layer are spaced by a predetermined distance, and the droplet is arranged between the first hydrophobic layer and the second hydrophobic layer;
a first insulation layer covering the first electrode, wherein the second electrode is arranged on the first insulation layer;
a second insulation layer covering the second electrode, wherein the first hydrophobic layer is arranged on the second insulation layer; and
a spacer arranged between the first hydrophobic layer and the second hydrophobic layer and configured to support the second hydrophobic layer in such a manner that the first hydrophobic layer and the second hydrophobic layer are spaced by the predetermined distance, the droplet control and detection device is integrated in a display substrate, the display substrate is an OLED display substrate, the light source is a light-emitting unit of the OLED display substrate, the first electrode is a patterned cathode of the OLED display substrate, the first insulation layer is a thin film encapsulation layer of the OLED display substrate, the second electrode is an electrode formed on the thin film encapsulation layer, the photoelectric detection structure is a photodiode or a photosensitive thin film transistor integrated in the OLED display substrate,
wherein the operating method comprises:
controlling the light source to emit light;
detecting, by the photoelectric detection structure, the light emitted by the light source and reflected by the droplet;
obtaining the droplet information according to the detection result;
controlling the electrical signal applied on the first electrode and the second electrode according to the droplet information in such a manner that the droplet is driven to move by the electric field generated between the first electrode and the second electrode;
turning on the light-emitting unit of the OLED display substrate;
detecting, by the photodiode or the photosensitive thin film transistor integrated in the OLED display substrate, the light emitted by the light source and reflected by the droplet; and
obtaining the droplet information according to the detection result, and controlling an electrical signal applied on the patterned cathode of the OLED display substrate and the second electrode according to the droplet information.

11. A microfluidic device, comprising:
a base substrate;
a pixel circuit and a photoelectric detection structure on the base substrate, wherein the pixel circuit comprises an anode;
a light-emitting unit on the pixel circuit and the photoelectric detection structure;
a cathode on the light-emitting unit, wherein the light-emitting unit is capable of emitting light under the effect of an electric field generated between the anode and the cathode;
an insulating film encapsulation layer on the cathode;
a second electrode on the film encapsulation layer;
a first hydrophobic layer on the second electrode;
a droplet and a spacer on the first hydrophobic layer;
a second hydrophobic layer on the droplet and the spacer, wherein the droplet is movable under an electric field generated between the cathode and the second electrode, and the spacer is configured to support the second hydrophobic layer in such a manner that the first hydrophobic layer and the second hydrophobic layer are spaced by a predetermined distance,
wherein the microfluidic device further comprises:
a processing circuit, configured to obtain droplet information according to a detection result of the photoelectric detection structure, control an electrical signal applied on the cathode and the second electrode according to the droplet information, and control the droplet to be moved by the electric field generated between the cathode and the second electrode.

12. The microfluidic device according to claim 11, wherein the droplet information comprises at least one of a position parameter, an appearance parameter and a component parameter of the droplet.

13. The microfluidic device according to claim 11, further comprising:
a protection layer covering the second hydrophobic layer.

14. The microfluidic device according to claim 11, wherein each of the cathode and the second electrode comprises a plurality of strip-shaped electrodes, and an extension direction of the strip-shaped electrodes of the cathode is perpendicular to an extension direction of the strip-shaped electrodes of the second electrode.

15. The microfluidic device according to claim 11, wherein a difference value between a width of the cathode and a diameter of the droplet is not greater than a preset threshold, and a difference value between a width of the second electrode and the diameter of the droplet is not greater than the preset threshold.

16. The microfluidic device according to claim 11, wherein the photoelectric detection structure is a photodiode or a photosensitive thin film transistor.

* * * * *